United States Patent [19]

Hong

[11] Patent Number: 5,627,091
[45] Date of Patent: May 6, 1997

[54] MASK ROM PROCESS FOR MAKING A ROM WITH A TRENCH SHAPED CHANNEL

[75] Inventor: Gary Hong, Hsin-Chu, Taiwan

[73] Assignee: United Microelectronics Corporation, Hsin-Chu, Taiwan

[21] Appl. No.: 251,979

[22] Filed: Jun. 1, 1994

[51] Int. Cl.$^6$ ............................................. H01L 21/265
[52] U.S. Cl. .......................... 438/276; 438/278; 438/282; 438/291
[58] Field of Search ......................... 437/45, 48, 52, 437/44

[56] References Cited

U.S. PATENT DOCUMENTS

| 3,660,819 | 5/1972 | Frohman-Bentchkowsky | 365/185 |
|---|---|---|---|
| 4,099,196 | 7/1978 | Simko | 365/185 |
| 4,114,255 | 9/1978 | Salsbury et al. | 437/43 |
| 4,142,926 | 3/1979 | Morgan | 156/653 |
| 4,198,693 | 4/1980 | Kuo | 365/104 |
| 4,203,138 | 5/1980 | Elenbaas | 300/37 |
| 4,266,283 | 5/1981 | Perlegos et al. | 365/104 |
| 4,317,272 | 3/1982 | Kuo et al. | 365/185 |
| 4,328,565 | 5/1982 | Harari | 365/185 |
| 4,412,310 | 10/1983 | Korsh et al. | 365/185 |
| 4,432,075 | 2/1984 | Eitan | 365/185 |
| 4,797,856 | 1/1989 | Lee et al. | 365/185 |
| 4,868,619 | 9/1989 | Mukherjee et al. | 257/300 |
| 4,868,629 | 9/1989 | Eitan | 365/185 |
| 4,975,384 | 12/1990 | Baglee | 437/43 |
| 5,115,288 | 5/1992 | Manley | 365/185 |
| 5,220,528 | 6/1993 | Mielke | 365/185 |
| 5,270,257 | 12/1993 | Shiu | 437/44 |
| 5,376,570 | 12/1994 | Jung et al. | 437/44 |

Primary Examiner—Jey Tsai
Attorney, Agent, or Firm—Meltzer, Lippe, Goldstein et al.

[57] ABSTRACT

A memory cell, and process for making it, having a long channel and narrow buried bit line is disclosed. The memory cell is formed in a substrate having a first dopant type. A trench is defined in the substrate. Source/drain regions of a second dopant type are formed on the surface of the substrate to each side of the trench. A gate oxide layer is formed over the substrate and a polysilicon wordline deposited over the gate oxide layer. A channel is defined along the walls of the trench. Ions are implanted in the bottom of the trench defining the channel for a cell that is selected to be in the off state. The long channel and narrow bit line of these memory cells overcome the problem of high bit line resistance and low junction breakdown voltage found in conventional memory cells.

9 Claims, 4 Drawing Sheets

MASK ROM PROCESS FOR MAKING A ROM WITH A TRENCH SHAPED CHANNEL

FIELD OF THE INVENTION

The present invention relates to a mask ROM process and structure. Specifically, it relates to a process and structure for a ROM array which has a long channel and narrow bit: line, so as to overcome the problem of high bit line resistance and low injunction breakdown voltage.

RELATED APPLICATION

Two patent applications one entitled "Buried Bit Line ROM with Low Bit Line Resistance" bearing Ser. No. 08/092,189 was filed on Jul. 14, 1993 now U.S. Pat. No. 5,430,673 and the other entitled "Self-Aligned Buried $N^+$ Bit Line Mask ROM Process" bearing was filed on Apr. 20, 1994 are assigned to the assignee hereof. These applications contain subject matter related to the subject matter of the present application and are hereby incorporated by reference.

BACKGROUND OF THE INVENTION

A ROM is an array of ROM cells. A top view of a conventional array of ROM cells is shown in FIG. 1 and a cross section of an individual cell is shown in FIG. 2. A ROM array has some cells which are conductive and some cells which are not conductive. A ROM mask process allows selective implantation of the ROM code, so that some cells are conductive and some are not. The purpose of a mask ROM process is to enable some cells to be conductive and others to not be conductive. This is accomplished by selective implantation of ions, such as boron, in the channels of the cells.

Referring to FIGS. 1 and 2, the ROM array 10 is formed on a substrate 11 having a first dopant type. Illustratively, the substrate is P-type silicon with a doping concentration of $1 \times 10^{14}/cm^3 \sim 8 \times 10^{15}/cm^3$. A plurality of parallel $N^+$ type buried bit lines 12 are formed in the substrate 11. A plurality of polysilicon word lines 14 are formed orthogonal to the bit lines on the surface of the substrate 11. The ROM comprises a plurality of cells. One such cell 13 is delineated in FIG. 1 and shown in a cross-sectional view taken along line AA' in FIG. 2.

As shown in FIG. 2, the cell 13 comprises two parallel buried bit lines 12 which form source and drain regions for the cell. A channel 20 of length S is formed between the two bit lines in the cell 13. A gate oxide layer 21 is formed on top of the substrate 11. The oxide layer is thick at portions 22 which are located above the bit lines 12 and thin at portion 23 located over the channel 20. The thick portions 22 are approximately 300 to 1000 Å and the thin portions 23 are approximately 100 to 200 Å. A polysilicon layer is deposited and patterned to form polysilicon word line 14 over the gate oxide layer 21. A photo resist layer 25 is formed and patterned on the polysilicon wordlines 14 as a mask. The channel 20 becomes conducting when a voltage is applied on the polysilicon word line 14 over the channel 20. The boron 26 is implanted in the selected cells to raise the threshold voltage ($V_T$) of the cell, which in turn, turn off the conducting state for the "off" cell (this programs the cell). Thus, cells implanted with boron cannot be turned on when a voltage ms applied to the appropriate word line.

Each bit line has a width W. The spacing between adjacent bit lines is S. Illustratively, W is 0.6 microns and S is 0.6 microns. When the cell dimension shrinks, i.e., a smaller device size, the bit line width also shrinks and the bit line sheet resistance increases. In addition, the punch-through voltage between adjacent bit lines becomes unacceptably low. Therefore, conventional ROM structures have unavoidably high bit line resistance and low junction breakdown problems.

It is an object of the present invention to provide a mask ROM structure and process which overcome the high bit line resistance and low injunction breakdown voltage problems of conventional mask ROM structures.

Another object of the present invention, is to provide a mask ROM structure, which has much better bit line to bit line punch-through voltage. Therefore, the memory cell can be further shrunk for higher density IC applications.

SUMMARY OF THE INVENTION

The present invention achieves these objectives and others by providing a ROM cell structure having a long channel and narrow bit lines. A memory cell is provided which comprises a substrate of a first dopant type having a trench formed therein. First and second parallel buried bit lines of a second dopant type are implanted on the surface of the substrate on each side of the trench. A gate oxide layer is formed over the substrate. A polysilicon wordline is deposited over the gate oxide layer. The first and second parallel buried bit lines form source/drain regions for the cell. A channel is defined along the walls of the trench. A process is also provided which comprises the steps of implanting a layer having a second dopant type in a substrate having a first dopant type. The next step is to form and pattern a first photo-resist layer over the doped layer. Next, the patterned first photo-resist is used as a mask to form trenches in the first doped layer and the substrate. Narrow buried bit lines are thereby formed from the first dopant type layer and long channels are defined along the walls of the trenches between the buried bit lines. The next step is the removal of the first photo-resist layer. Next, an oxide layer is grown over the substrate including over the buried bit lines. A word line is deposited over the oxide layer.

The process comprises additional steps of forming a photo-resist layer over the word line, forming a code opening in the second photo-resist layer over a channel selected to be implanted, and implanting ions into the selected channel, thereby programming the cell and turning the transistor off.

The memory cell of the present invention is advantageous because it overcomes the problem of high bit line resistance and low injunction breakdown voltage. Also, the cell structure of the present invention provides high bit line punch through resistance (voltage) suitable for shrinking and high density memory array applications.

DETAILED DESCRIPTION OF THE INVENTION

Figure 1:
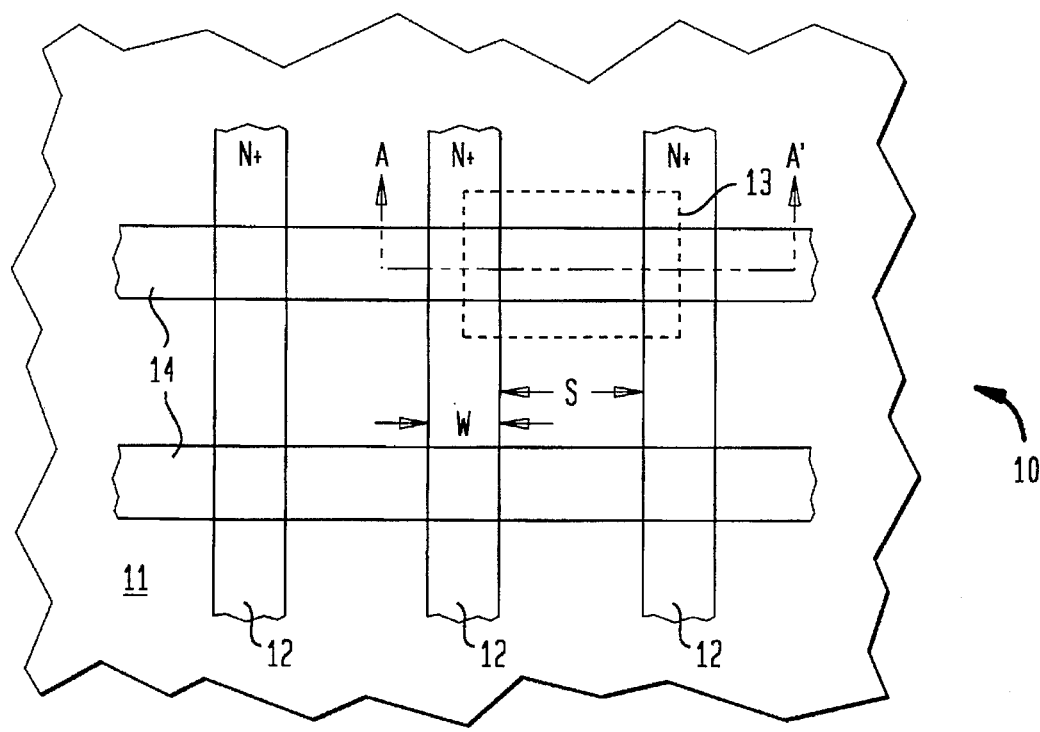
FIG. 1 illustrates a conventional buried bit line ROM array.
Figure 2:
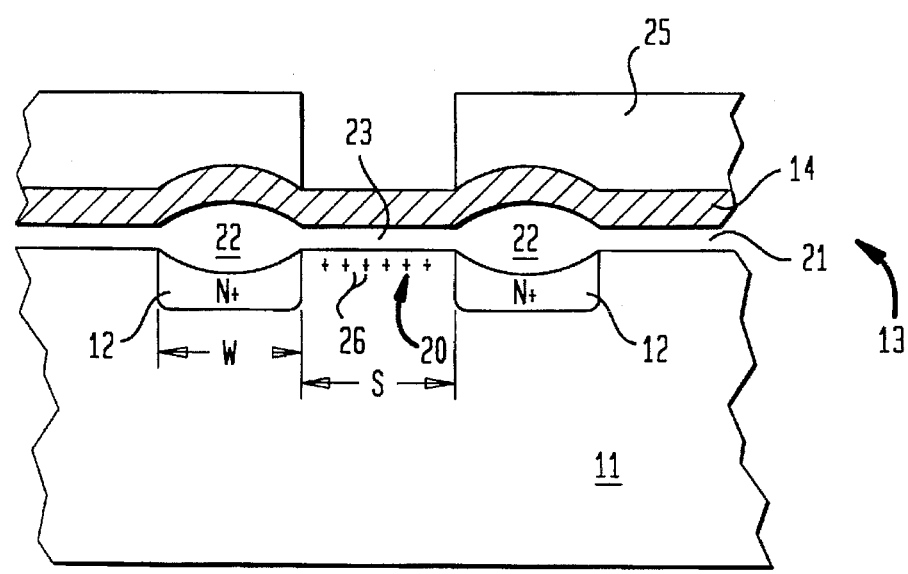
FIG. 2 illustrates a cross-section of one ROM cell of FIG. 1.
Figure 3:
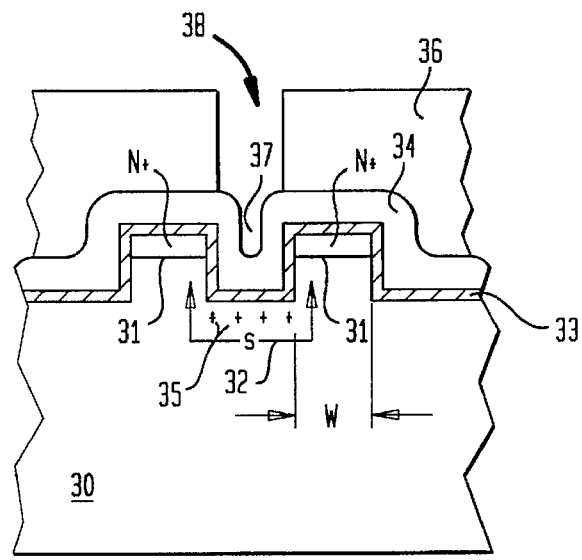
FIG. 3 illustrates a memory cell according to the present invention.

Referring to FIG. 3, a ROM cell mask according to the present invention comprises a substrate 30 having a first dopant type. A trench 37 is formed in the substrate. The trench is formed to a depth of about 0.1 μm to about 1.0 μm in the substrate. The substrate can be P-type silicon with a doping concentration of about $1 \times 10^{14}/cm^3$ to about $5 \times 10^{15}/cm^3$. Two parallel buried bit lines 31 having a second dopant type are formed on the surface of the substrate 30 on either side of the trench 37. The buried bit lines 31 form the source/drain regions of the cell and, for example, are doped $N^+$. A gate oxide 33 is grown over the substrate to a thickness of approximately 100 to 200 Å. A polysilicon wordline 34 is formed or deposited over the gate oxide to a thickness of about 1000 Å to about 5000 Å. The channel 32 of the cell is defined along the walls of the trench 37 and has a length indicated by S. The width of the bit lines is indicated by W. Illustratively, S is about 1.0 μm and W is about 0.6 μm. The bottom of the channel 32 has been implanted with ions so that it is non-conductive, meaning that the threshold voltage $V_T$ is high. Therefore, when $V_{cc}$, for example, is applied on the gate, the channel is still non-conductive, if $V_T > V_{cc}$. The ions were implanted through the photo-resist mask 36. The photo-resist mask 36 has a code opening 38 over the trench 37 through which the ions were implanted. Illustratively, the ion could be $B_{11}$, implanted at about 100 key with a dose unit of about $1 \times 10^{14}/cm^2$.

Figure 4:
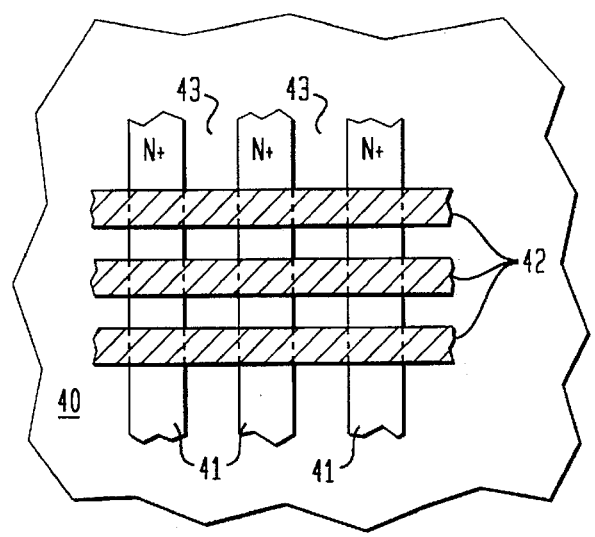
FIG. 4 illustrates a memory array of the present invention.

FIG. 4 illustrates a top view of a buried bit line ROM array of the present invention which comprises a substrate 40 of a first dopant part. The substrate can be a P-type or P-well silicon substrate having a doping concentration of about $1 \times 10^{14}/cm^3$ to $5 \times 10^{15}/cm^3$.

A plurality of parallel $N^+$ type buried bit lines 41 are formed in the substrate 40. A plurality of polysilicon or polysilicide word lines 42 are formed on the surface of the substrate 40 orthogonal to the buried bit lines 41. The polysilicon wordlines are formed to a thickness of approximately 1000 Å to 5000 Å. Trench areas 43 are defined between the buried bit lines 41.

Figure 5:
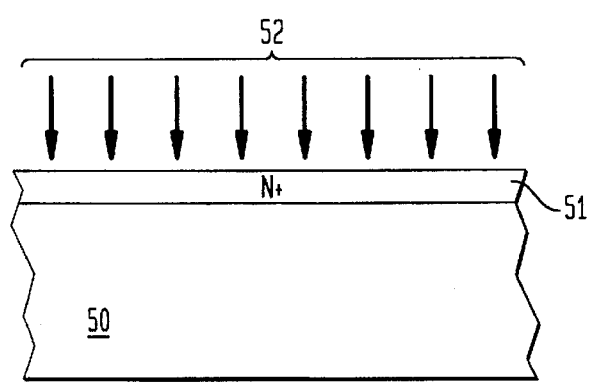
FIGS. 5, 6A, 6B, 6C and 7 and 8 illustrate one embodiment of the process of the present invention.
Figure 6A:
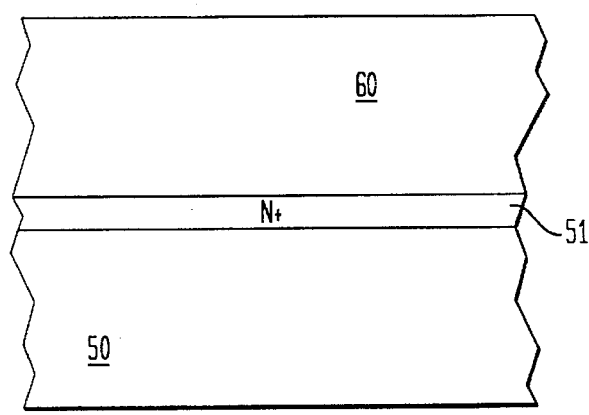
Figure 6B:
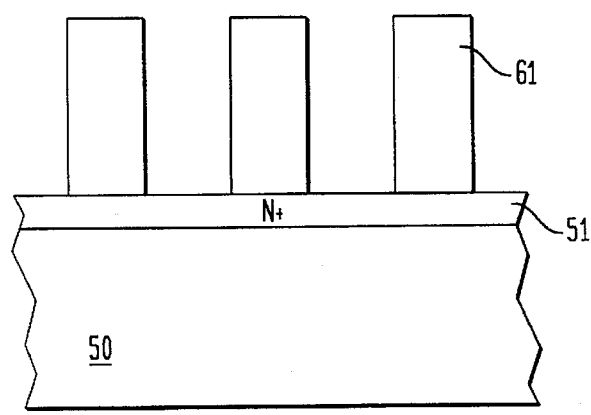
Figure 6C:
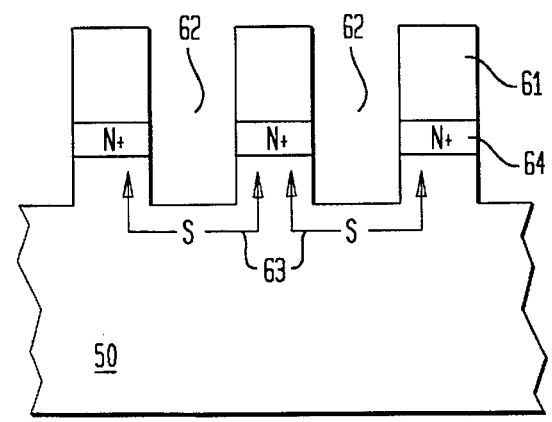

The process of the present invention is illustrated in FIGS. 5 to 8. Referring to FIG. 5, a layer 51 having a second dopant type is implanted in the substrate 50 having a first dopant type. Illustratively, the substrate is P-type silicon with a doping concentration of about $1 \times 10^{15}/cm^3$ and the second dopant type is $N^+$. The $N^+$ layer 51 is formed by ion implantation of Arsenic, as indicated by arrows 52, using an energy of about 50 key and a dopant dose of approximately $3 \times 10^{15}/cm^2$. This layer is approximately 0.2 μm thick and forms the bit lines of the cell. Referring to FIGS. 6 (a)–6 (c), a layer of photo-resist 60 having a thickness of about 1 μm is formed over the $N^+$ layer 51. The photo-resist is patterned to form a mask 61. The next step is to etch the trenches 62 into the $N^+$ layer and the silicon substrate to a depth of approximately 0.4 μm. The trench etch is performed using the photo-resist mask 61. This trench etch forms the channels 63 of the cell. The channels 63 are defined along the walls of the trenches 62 as indicated by S. The $N^+$ areas 64 become the source/drain regions of the memory cells. Then, the photo-resist is removed or stripped.

Figure 7:
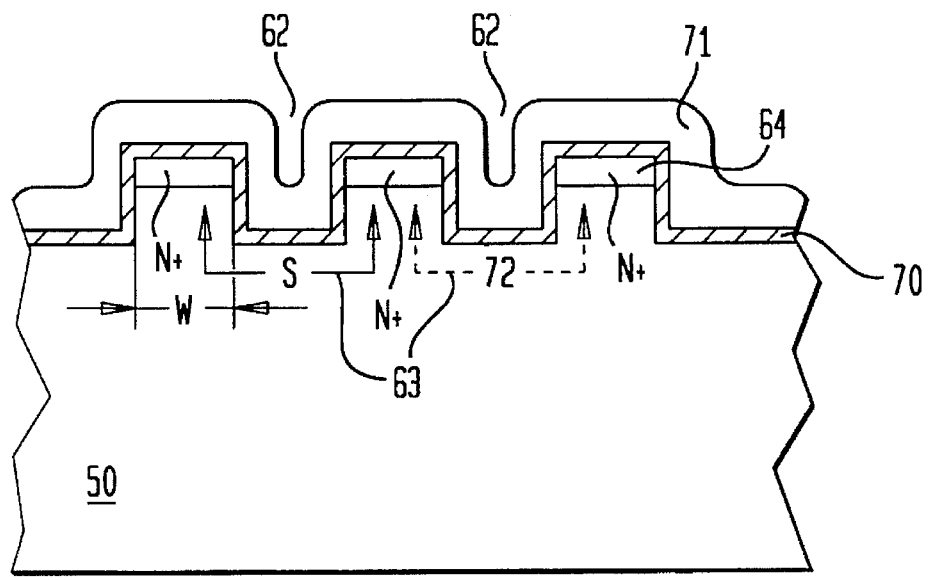

Referring to FIG. 7, a gate oxide layer 70 is formed over the structure to a thickness of approximately 100 Å to 200 Å. Next a polysilicon or polysilicide layer having a thickness of approximately 1000 Å to 5000 Å is deposited over the gate oxide 70. The polysilicon layer is then patterned to form word lines 71. These steps form a long channel along the walls of the trench 62 and a narrow bit line 64. The channel length S is approximately 1.0 μm and the width W of the narrow bit line is about 0.6 μm. The channel length S is approximately the trench depth plus the space between the trench or its width. Channel conduction is along the trench walls as indicated by 72.

Figure 8:
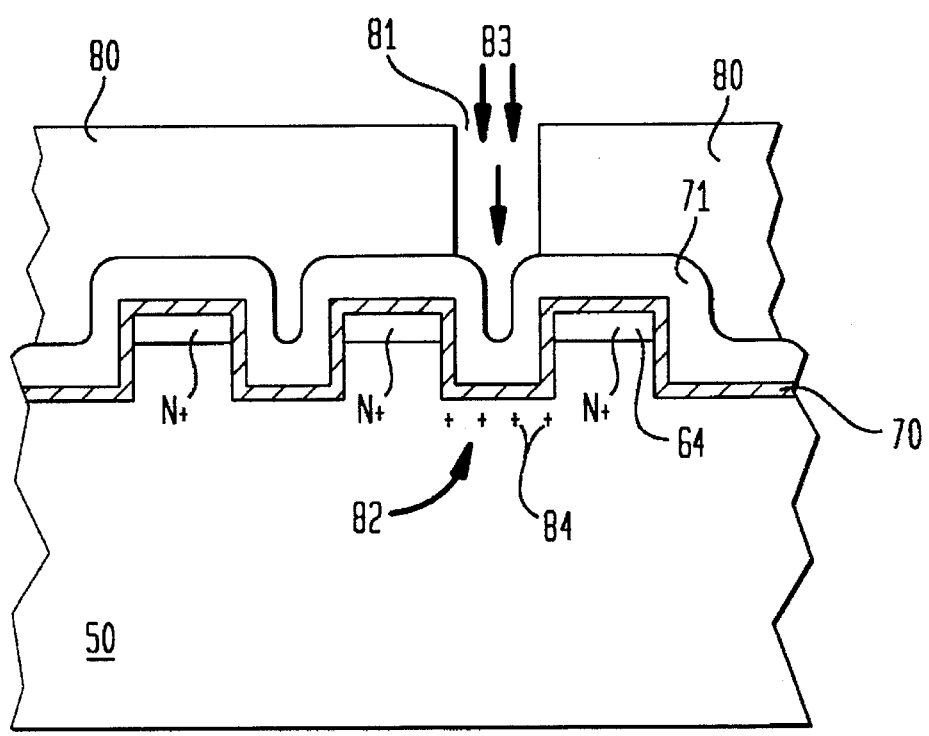

As shown in FIG. 8, in the next step a layer of photo-resist 80 having a thickness of approximately 1 μm to about 2 μm is formed over the poly word line 71 as ROM code masking. A ROM code opening 81 is patterned in the photo-resist 80 above the channel 82, which was selected to be in the "off" state. Boron is ion implanted, as indicated by arrows 83, through the opening 81 using an energy of about 100 key. The Boron ion used can be $B_{11}$ with a dose unit of approximately $1 \times 10^{14}/cm^2$. The boron is implanted only in the bottom of the trench 62 and close to the center of the selected channel 82, as designated by 84. This accomplishes the selective implantation for the "off" state.

The rest of the process for completing the ROM array are conventional back-end processes, including BPSG, flow, contacts, and metallization.

The implanted Boron ions only go into the channel area trench bottom. This is sufficient to raise the threshold voltage $V_T$ of the memory cell or to turn-off the transistors of the memory cells. Since the implanted Boron ions do not counter-dope the $N^+$ source/drain regions, which are on the top surface areas, the bit line resistance will not be increased by the Boron (p-type). Higher bit line junction breakdown voltage and lower bit-line to p-type silicon capacitance will be obtained by preventing the implanted Boron ion from contacting the $N^+$ source/drain region. Also, a longer channel length for the memory cell is obtained, which results in a higher bit line punch-through voltage.

Finally, the above-described embodiments of the invention are intended to be illustrative only. Numerous alternative embodiments may be devised by those skilled in the art without departing from the spirit and scope of the following claims.

I claim:

1. A process for making a memory array comprising:
    forming a first doped layer having a second conductivity type in a substrate having a first conductivity type,
    forming and patterning a first photo-resist layer over said first doped layer,
    using said patterned first photo-resist layer as a mask to form a trench shaped channel having two vertical sides, each side having substantially the same height, and a bottom having a width, in said first doped layer and said substrate to form buried bit source and drain lines in said first doped layer, said source and drain lines being separated by said channel so that an effective channel length of said channel between said source line and said drain line is approximately equivalent to twice the height of said vertical side of said channel plus the width of said bottom of said channel,
    growing an oxide layer over said substrate including said first doped layer, and
    depositing a word line over said oxide layer.

2. The process of claim 1, further comprising,
    forming a photo-resist layer over said word line,
    forming a code opening in said photo-resist layer over a channel of a transistor that is to be in an off state and
    implanting ions into said channel of said transistor that is to be in an off state.

3. The process of claim 2, wherein said second conductivity type is $N^+$ and said first conductivity type is P.

4. The process of claim 2, wherein said step of forming a first doped layer further comprises ion implantation of Arsenic at an energy of about 50 keV and a dose unit of approximately $3 \times 10^{15}/cm^2$.

5. The process of claim 2, wherein said oxide layer is a gate oxide.

6. The process of claim 2, wherein said word line is made from a polysilicon.

7. The process of claim 2, wherein the ion implantation comprises, implanting boron ions in said selected channel at an energy of 100 key and a dose unit of $1 \times 10^{14}/cm^2$.

8. The process of claim 7, wherein said boron ions are $B_{11}$.

9. The process of claim 2, wherein said implanting ions go only into said bottom of said channel to program or turn off transistors of said memory array and said implanted ions do not counter-dope said substrate of said first conductivity type.

* * * * *